United States Patent
Lee et al.

(10) Patent No.: US 8,089,148 B1
(45) Date of Patent: Jan. 3, 2012

(54) CIRCUIT BOARD AND SEMICONDUCTOR DEVICE HAVING THE SAME

(75) Inventors: Jun Su Lee, Kyunggi-do (KR); Min Jae Lee, Seoul (KR); Jae Dong Kim, Seoul (KR); Jae Jin Lee, Seoul (KR); Min Yoo, Seoul (KR); Byung Jun Kim, Kyunggi-do (KR)

(73) Assignee: Amkor Technology, Inc., Chandler, AZ (US)

( * ) Notice: Subject to any disclaimer, the term of this patent is extended or adjusted under 35 U.S.C. 154(b) by 275 days.

(21) Appl. No.: 12/539,116

(22) Filed: Aug. 11, 2009

(51) Int. Cl.
*H01L 23/48* (2006.01)

(52) U.S. Cl. ........ 257/734; 257/701; 257/703; 257/782; 257/E23.06; 257/E23.068; 438/125; 438/108

(58) Field of Classification Search .................. 257/693, 257/737, 738, 778, 782, E23.021, E23.039, 257/700–702, 734, E23.06, E23.068; 438/108, 438/125
See application file for complete search history.

(56) References Cited

U.S. PATENT DOCUMENTS

| | | | |
|---|---|---|---|
| 5,920,126 A | 7/1999 | Sohara | |
| 6,049,122 A | 4/2000 | Yoneda | |
| 6,229,711 B1 | 5/2001 | Yoneda | |
| 7,253,503 B1 * | 8/2007 | Fusaro et al. | 257/668 |
| 7,687,803 B2 * | 3/2010 | Takagi et al. | 257/48 |

* cited by examiner

*Primary Examiner* — Jasmine Clark
(74) *Attorney, Agent, or Firm* — Weiss & Moy, P.C.; Jeffrey D. Moy (57) ABSTRACT

A circuit board has an insulative layer including a first surface and a second surface opposite to the first surface. A plurality of electrically conductive patterns is formed on the first surface of the insulative layer. Conductive lands are formed in a die mounting region of the first surface of the insulative layer and electrically connected to one of the plurality of conductive patterns on the first surface. An extending pattern extends from the conductive lands to outside of the mounting region. A protective layer covers the first surface of the insulative layer and the electrically conductive patterns. A trench is formed in the protective layer to expose the conductive lands and the extending patterns.

15 Claims, 7 Drawing Sheets

CIRCUIT BOARD AND SEMICONDUCTOR DEVICE HAVING THE SAME

FIELD OF THE INVENTION

This invention relates to semiconductor devices and, more specifically, to a semiconductor device and method of manufacturing which reduces voids and air traps in the underfill disposed between the semiconductor device and the circuit board.

BACKGROUND OF THE INVENTION

In general, a circuit board includes an insulative layer, wiring patterns formed on the surface of the insulative layer, and a protective layer covering the insulative layer and the electrically conductive patterns. The circuit board electrically connects a semiconductor die to an external device and supports the semiconductor die.

A semiconductor device may include a circuit board. A semiconductor die may be mounted on the circuit board wherein a conductor may be used to electrically connect the circuit board to the semiconductor die. An underfill may be disposed in a gap formed between the circuit board and the semiconductor die to fix the semiconductor die to the circuit board. An encapsulant may be used to encapsulate the semiconductor die and the underfill. Solder balls may be welded to the circuit board and electrically connected to an external device.

During the process of forming a semiconductor device, a number of voids and air traps may form in the underfill disposed between the circuit board and the semiconductor die. These voids are a main factor of breaking the semiconductor device when the semiconductor device is put in high temperature circumstances. In other words, when the semiconductor device is put in high temperature circumstances, air or absorbed moisture in the voids expand. This expansion causes the voids to explode and thus the circuit board and the semiconductor die are electrically separated from each other.

Therefore, a need existed to provide a device and method to overcome the above problems. The device and method will reduce voids and air traps in the underfill disposed between the semiconductor device and the circuit board

SUMMARY OF THE INVENTION

A circuit board has an insulative layer including a first surface and a second surface opposite to the first surface. A plurality of electrically conductive patterns is formed on the first surface of the insulative layer. Conductive lands are formed in a die mounting region of the first surface of the insulative layer and electrically connected to one of the plurality of conductive patterns on the first surface. An extending pattern extends from the conductive lands to outside of the mounting region. A protective layer covers the first surface of the insulative layer and the electrically conductive patterns. A trench is formed in the protective layer to expose the conductive lands and the extending patterns.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Referring to FIGS. 1A to 1D, a circuit board 100 according to an exemplary embodiment of the present invention is shown. The circuit board 100 may include an insulative layer 110, electrically conductive patterns 120, and a protective layer 130.

The insulative layer 110 may include a first approximately planar surface 111 and a second approximately planar surface 112 on an opposite side of the first side 111. The insulative layer 110 may be one selected from a group of epoxy resin, phenolic resin, or an equivalent thereof. However, the material of the insulative layer 110 is not limited to the aforementioned. Moreover, the insulative layer 110 may have rigid properties so as to not being easily bent or flexible, but the properties of the insulative layer 110 are not limited thereto.

The electrically conductive patterns 120 may be formed on the first side 111 of the insulative layer 110. The electrically conductive patterns 120 may include conductive lands 121 that are formed in a mounting region 113 to which a semiconductor die (not shown) is mounted and electrically connected to the semiconductor die, and extending patterns 122 extending from the conductive lands 121 to the outside of the mounting region 113 by a preset distance. The extending patterns 122 may further have conductive vias 123 formed in the insulative layer 110. Meanwhile, the second side 112 of the insulative layer 110 may include electrically conductive patterns 140. The electrically conductive patterns 140 may include ball lands 141 to which solder balls (not shown) are soldered respectively. The electrically conductive patterns 120 of the first side 111 may be electrically connected to the electrically conductive patterns 140 of the second side 112 through the conductive vias 123. Both of the electrically conductive patterns 120 and 140 may be made of copper (Cu), but the present invention is not limited by the material.

The protective layer 130 may cover the first side 111 and the electrically conductive patterns 120 of the insulative layer 110. However, the protective layer 130 may have a plurality of trenches 131 to expose the conductive lands 121 and the extending patterns 122 to the outside. The trenches 131 may also expose portions of the insulative layer 110.

The trenches 131 may be formed in the mounting region 113 to which a semiconductor die is mounted. That is, each of the trenches 131 may have a width narrower than that of the mounting region 113 and a plurality of trenches 131 may be arrayed inside the mounting region 113. In other words, the trenches 131 may be formed inside the mounting region 113 to have an approximately linear shape, and expose the plurality of conductive lands 121 and the extending patterns 122 to the outside. The trenches 131 may be formed along the plurality of conductive lands 121 inside the mounting region 113 to have an approximately linear shape. A plurality of conductive lands 121 and the extending patterns 122 may be exposed to the outside through a single trench 131.

Figure 1A:
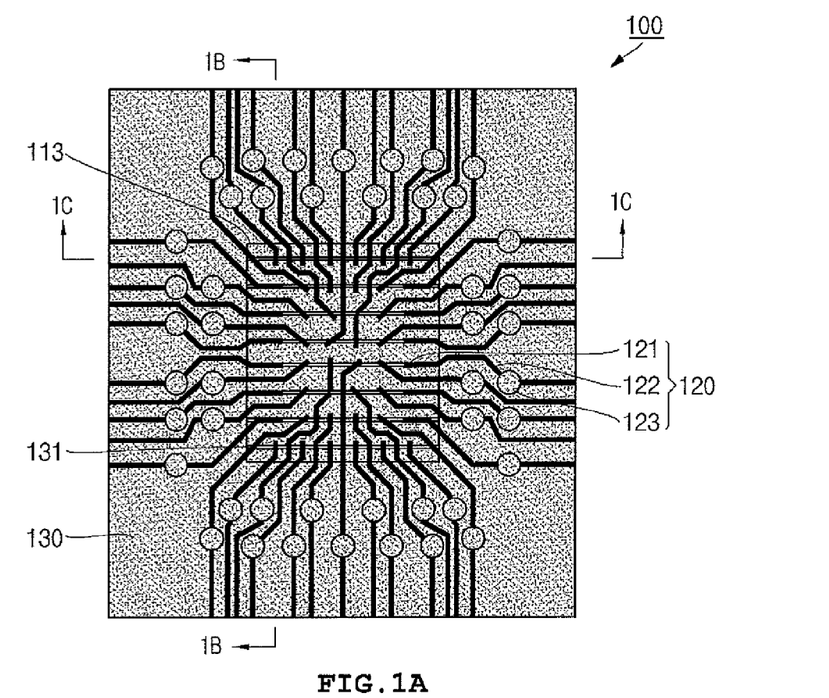
FIG. 1A is a plan view illustrating a circuit board according to an embodiment of the present invention.
Figure 1B:
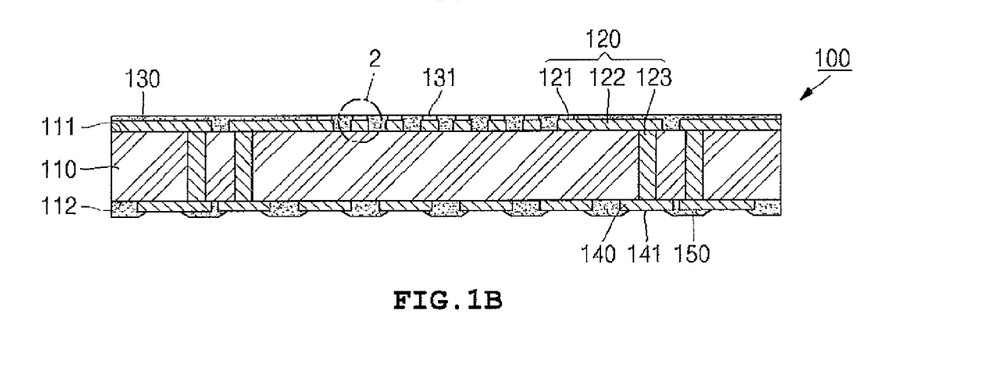
FIG. 1B is a sectional view taken along the line 1B-1B of FIG. 1A.
Figure 1C:
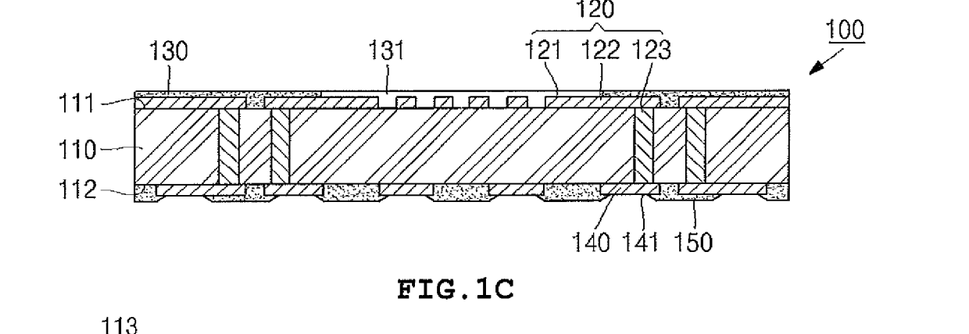
FIG. 1C is a sectional view taken along the line 1C-1C of FIG. 1A.
Figure 1D:
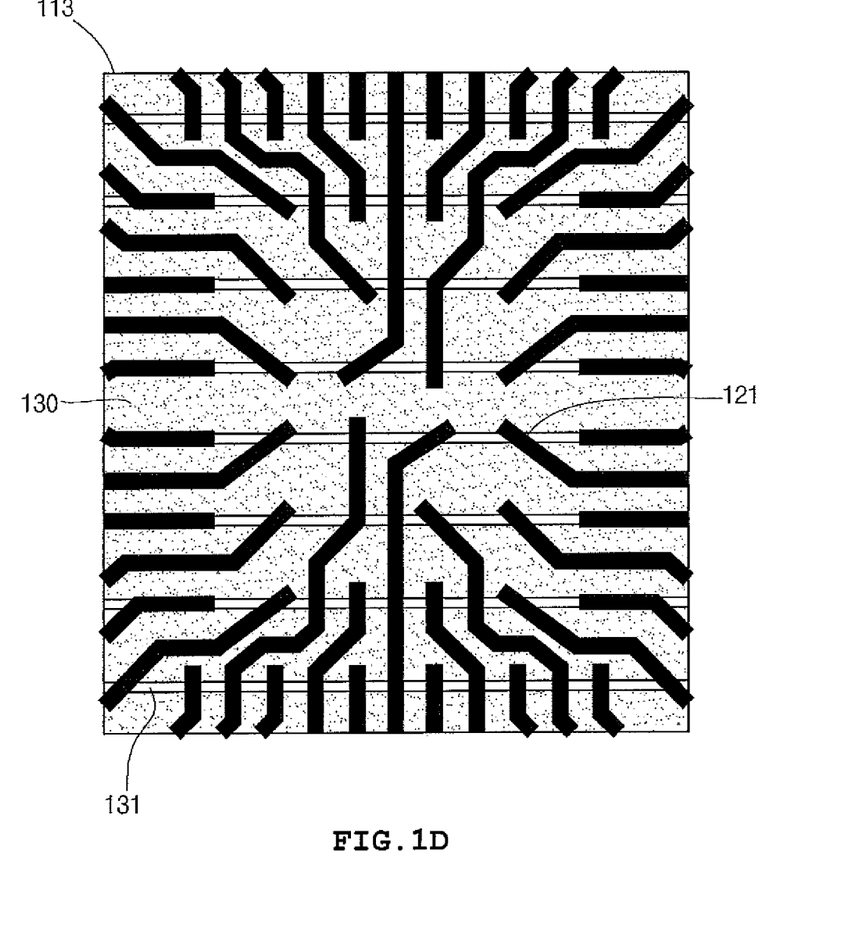
FIG. 1D is an enlarged plan view of a mounting unit of the circuit board.

For example, as illustrated in FIG. 1D, a plurality of trenches 131 may be formed to maintain a preset distance there between in the mounting region 113. The trenches 131 may be approximately parallel to each other in the longitudinal direction in the mounting region 113. However, the trenches 131 may be formed in a non-liner or curved fashion. The trenches 131 of the protective layer 130 may expose all of the conductive lands 121 of the mounting region 113 and some parts of the extending patterns 122 connected thereto. The trenches 131 may further expose some parts of the first side 111 of the insulative layer 110 to the outside.

The electrically conductive patterns 140 of the second side 112 may be covered with the protective layer 150, and ball lands 141 of the electrically conductive patterns 140 may be exposed over the protective layer 150 to the outside. The protective layers 130 and 150 may be any one selected from a group of plolyimide (PI), benzocyclobutane (BCB), polybenzoxazole (PBO), bismaleimide triazine (BT), phenolic resion, epoxy, silicone, and equivalents thereof, but are not limited thereto.

The plurality of trenches 131 may be formed in the mounting region 113 of the circuit board 100 to which the semiconductor die is mounted such that the underfill dispensed along the circumference of the mounting region 113 is permitted to flow easily inward of the mounting region 113. The plurality of conductive lands 121 may be connected to each other spatially in the longitudinal or lateral direction through the trenches 131 to allow the easy flow of the underfill and to prevent the voids and air traps from being generated during the underfill dispensing. Thus, in a completed semiconductor device, voids and air traps are not generated in the underfill disposed between the semiconductor device and the circuit board.

Figure 2:
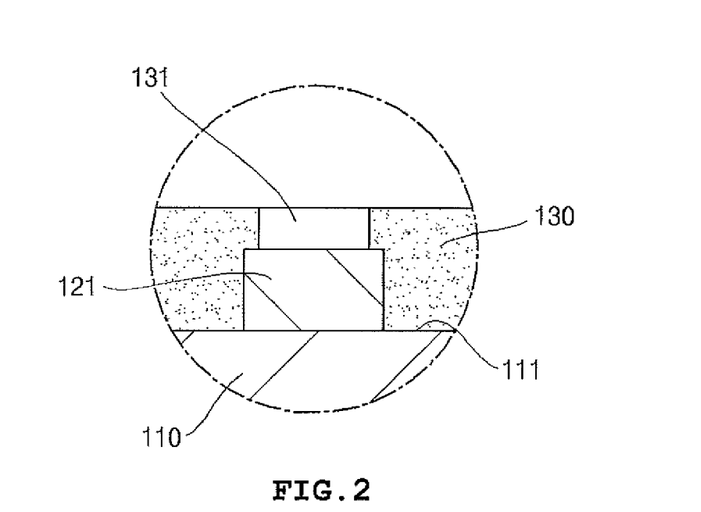
FIG. 2 is an enlarged view of a region 2 of FIG. 1B.

As illustrated in FIG. 2, the trenches 131 (that is, a region without the protective layer 130) may be formed in a region of the electrically conductive patterns corresponding to the conductive lands 121 such that the conductive lands 121 are exposed to the outside. Moreover, the circumferences of the conductive lands 121 may be covered with the protective layer 130. That is, the protective layer 130 may be formed in the form of a solder mask defined (SMD). Thus, due to the configuration of the SMD, an actual depth to be filled with the underfill is decreased, and the voids and the air traps of the underfill are decreased more effectively.

Figure 3:
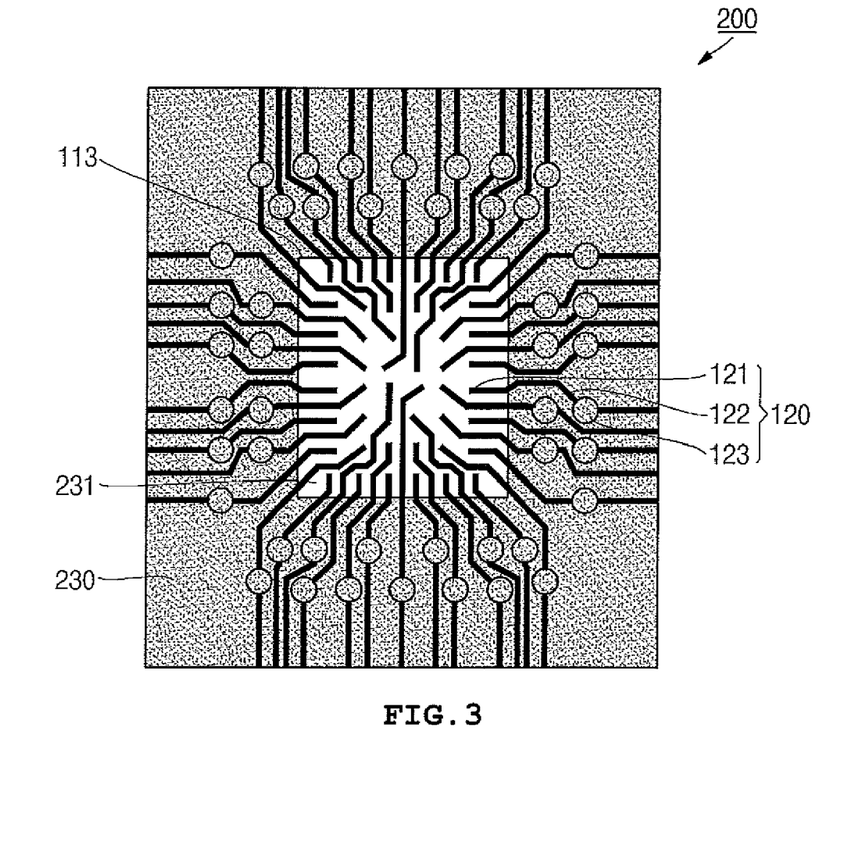
FIG. 3 is a plan view illustrating a circuit board according to another embodiment of the present invention.

As illustrated in FIG. 3, a circuit board 200 may have a trench 231 that is formed in a protective layer 230 and has the same area as that of a mounting region 113. That is, in the mounting region 113 of the circuit board 200, the protective layer 230 is not formed, but the window-shaped trench 231 is formed. All of conductive lands 121, extending patterns 122, and a first side 111 of an insulative layer 110 in the mounting region 113 may be exposed to the outside through the trench 231. Thus, in the circuit board 200, the window-shaped trench 231 is formed in an overall mounting region 113 to which a semiconductor die is mounted so that the underfill can easily flow toward the mounting region 113 during the underfill dispensing.

Figure 4:
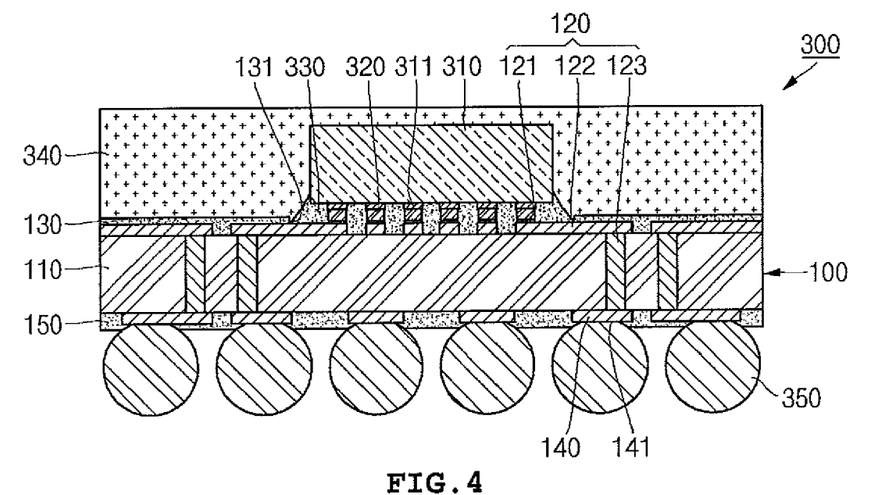
FIG. 4 is a sectional view illustrating a semiconductor device according to still another embodiment of the present invention.

As illustrated in FIG. 4, a semiconductor device 300 according to still another embodiment of the present invention includes a circuit board 100, a semiconductor die 310, an electrical conductor 320, an underfill 330, an encapsulant 340, and solder balls 350.

The circuit board 100 includes an insulative layer 110, electrically conductive patterns 120, and a protective layer 130. Since the circuit board 100 has been sufficiently described, its detailed description will be omitted in this embodiment of the present invention.

The semiconductor die 310 may include a plurality of bond pads 311. In the semiconductor die 310, the bond pads 311 face the circuit board 100 and may be positioned in a mounting region of the circuit board 100.

The electrical conductor 320 electrically connects the conductive lands 121 of the circuit board 100 to the bond pads 311 of the semiconductor die 310. The electrical conductor 320 may be any one selected from a group of conductive pillar, conductive bump, and equivalents thereof, but are not limited thereto. When the electrical conductor 320 is a conductive pillar, the electrical conductor 320 may include a copper pillar and a solder cap formed at an end of the copper pillar. When the electrical conductor 320 is a conductive bump, the electrical conductor 320 may be made of gold (Au), silver (Ag), solder (Sn—Pb), or an alloy thereof.

The underfill 330 may be dispensed between the circuit board 100 and the semiconductor die 310. The underfill 330 mechanically couples the circuit board 100 with the semiconductor die 310. That is, the underfill 330 prevents the semiconductor die 310 from being separated from the circuit board 100 due to an external physical shock or thermal shock. As described above, in the mounting region of the circuit board 100 to which the semiconductor die 310 may be mounted, a single or a plurality of trenches 131 are formed. Thus, the underfill 330 is easily dispensed into a gap between the circuit board 100 and the semiconductor die 310 so that voids and air traps are not generated.

The encapsulant 340 encapsulates the semiconductor die 310, the electrical conductor 320, and the underfill 330, which may be positioned on the circuit board 100. The encapsulant 340 protects the semiconductor die 310, the electrical conductor 320, and the underfill 330 from external physical, chemical, and thermal circumstances.

The solder balls 350 may be soldered to the ball lands 141 of the electrically conductive patterns 140. The solder balls 350 electrically connect the semiconductor device 300 to an external device. The solder balls 350 may be made of any one selected from a group of Sn—Pb, Sn—Pb—Ag, Sn—Pb—Bi, Sn—Cu, Sn—Ag, Sn—Bi, Sn—Ag—Cu, Sn—Ag—Bi, Sn—Zn, and equivalents thereof, but the materials of the solder balls 350 are not limited thereto.

Figure 5:
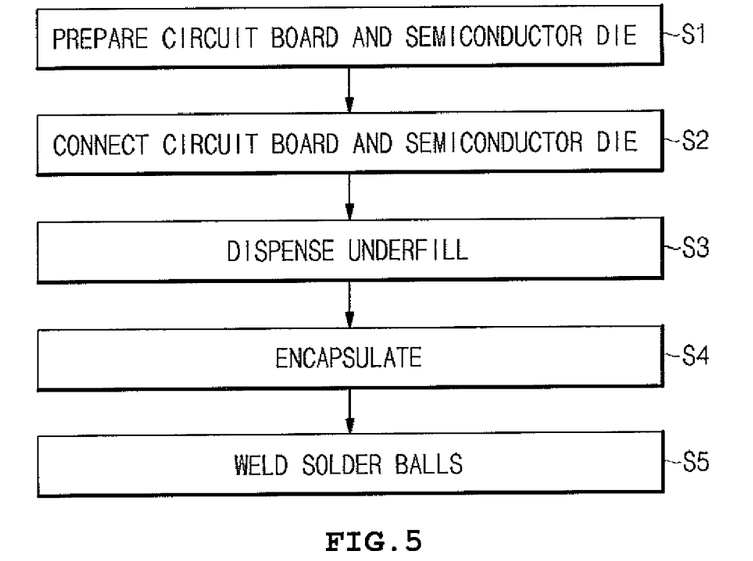
FIG. 5 is a flowchart illustrating a method of fabricating a semiconductor device according to still another embodiment of the present invention.

As illustrated in FIG. 5, a method of fabricating a semiconductor device according to still another embodiment of the present invention includes preparation of a circuit board and a semiconductor die (S1), connection of the circuit board and the semiconductor die (S2), dispensing of an underfill (S3), encapsulation (S4), and soldering of solder balls (S5).

Figure 6A:
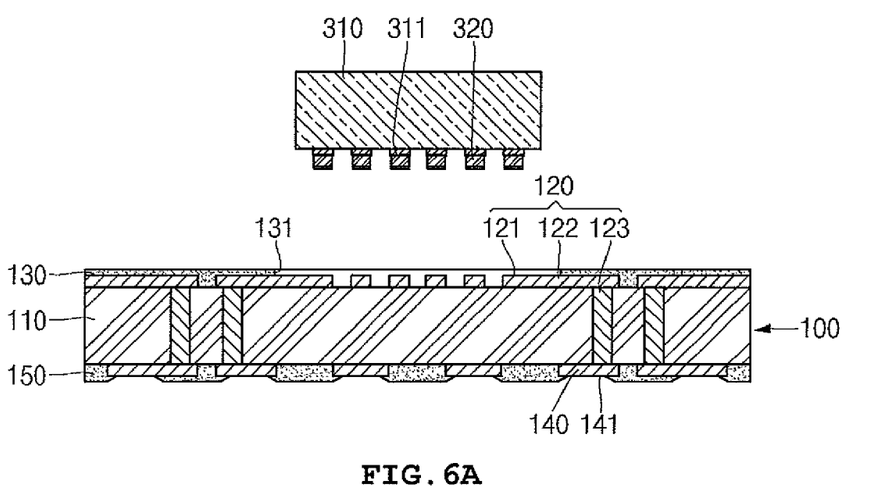
FIGS. 6A to 6F are sectional views sequentially illustrating the method of fabricating a semiconductor device according to still another embodiment of the present invention.

FIGS. 6A to 6F sequentially show sectional views illustrating the method of fabricating a semiconductor device according to still another embodiment of the present invention. As illustrated in FIG. 6A, in the preparation of a circuit board and a semiconductor die (S1), a circuit board 100 formed with a plurality of trenches 131 and a semiconductor die 310 formed with a plurality of electrical conductors 320 are prepared respectively. Since the circuit board 100 and the semiconductor die 320 formed with the electrical conductors 320 have been described above, their descriptions will be omitted.

Figure 6B:
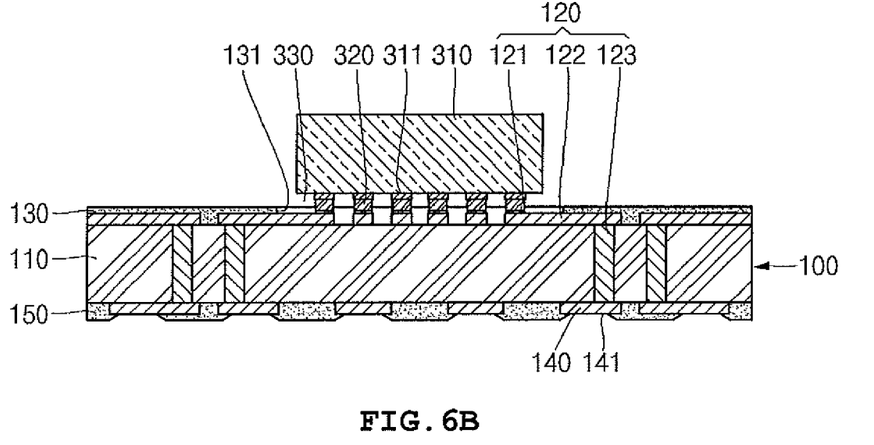

As illustrated in FIG. 6B, in the connection of the circuit board and the semiconductor die (S2) is shown. The electrical conductors 320 formed in the semiconductor die 310 may be electrically connected to the conductive lands 121 of the circuit board 100. For example, the electrical conductors 320 formed in the semiconductor die 310 may contact the conductive lands 121 of the circuit board 100. Then, the circuit board 100 may be put into a furnace of approximately 150 to 250 degrees Celsius. By doing so, the electrical conductors 320 are melted. After that, when the circuit board 100 is drawn out from the furnace and is cooled, the melted electrical conductors 320 are changed into solid state to securely fix the conductive pads 121 and the bond pads 311.

Figure 6C:
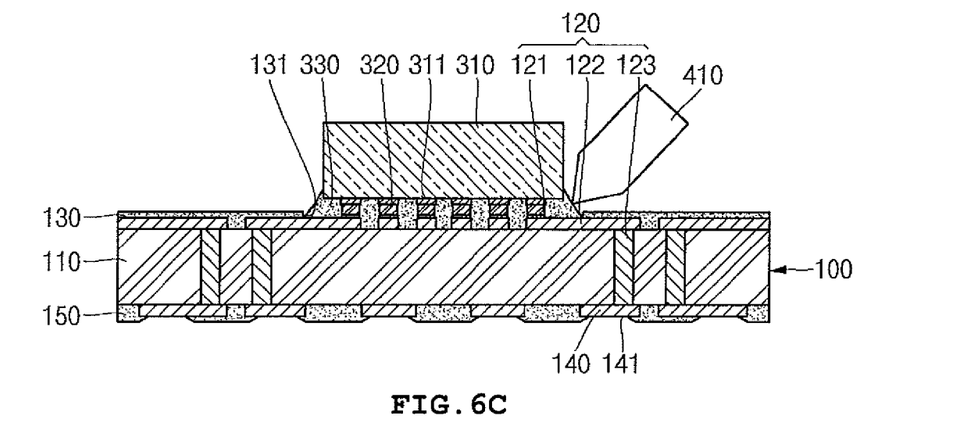
Figure 6D:
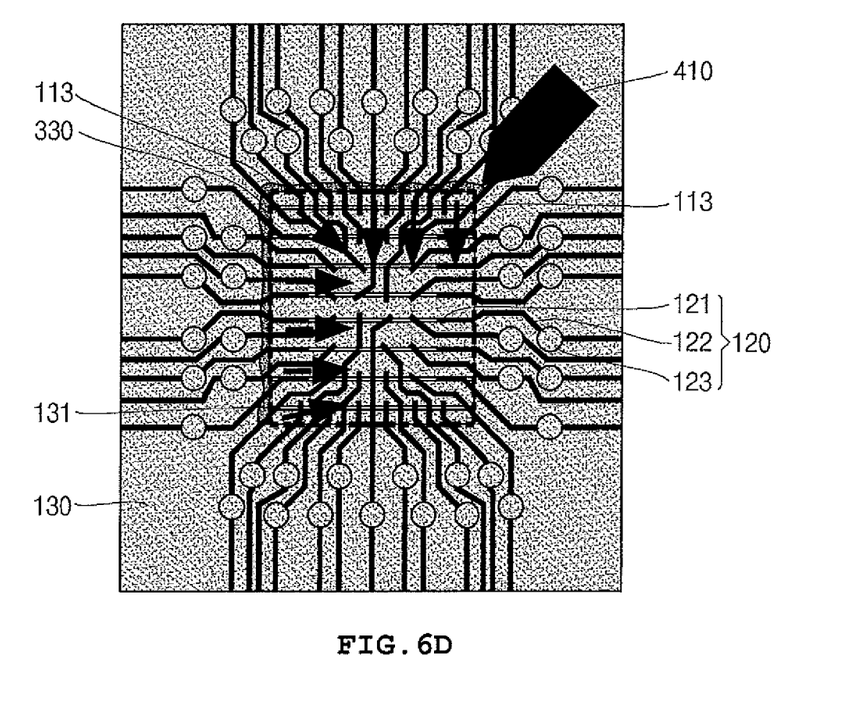

As illustrated in FIGS. 6C and 6D, in the dispersion of the underfill (S3), a predetermined amount of the underfill 330 may be dispensed around the semiconductor die 310 using a dispenser 410. At this time, the dispenser 410 travels the peripheral region of the semiconductor die 310 (that is, a peripheral region of the mounting region) along a traveling pattern such as 'I'-, 'U'-, 'L'-shaped traveling pattern while dispensing a preset amount of the underfill 330. Then, the underfill 330 is infiltrated into the gap between the circuit board 100 and the semiconductor die 310 due to capillary action. Moreover, since at least one trench 131 is further formed in the protective layer in a region of the circuit board 100, corresponding to the semiconductor die 310, that is the mounting region 113, the infiltration of the underfill 330 is carried out more easily. Due to the trench 131, voids and/or air traps are not generated in the underfill 330. FIG. 6D shows an L-shaped dispersion of the underfill 330 carried out by the dispenser 410. In FIG. 6D, the part depicted with a dotted line indicates the mounting region 113 corresponding to the semiconductor die 310 and an arrow indicates an infiltration direction of the underfill 330.

Figure 6E:
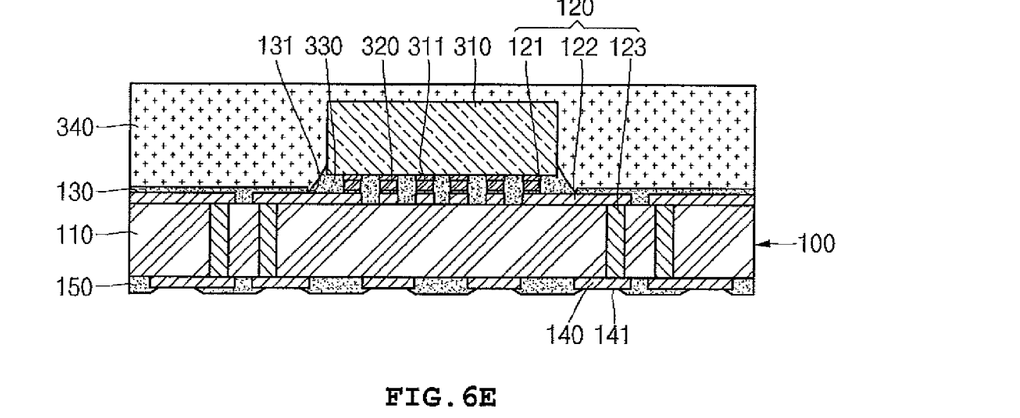

As illustrated in FIG. 6E, the encapsulation (S4), the semiconductor die 310 and the underfill 330 on the circuit board 100 may be encapsulated with the encapsulant 340. The encapsulation may be performed by transfer molding using a mold or by dispensing the encapsulant 340.

Figure 6F:
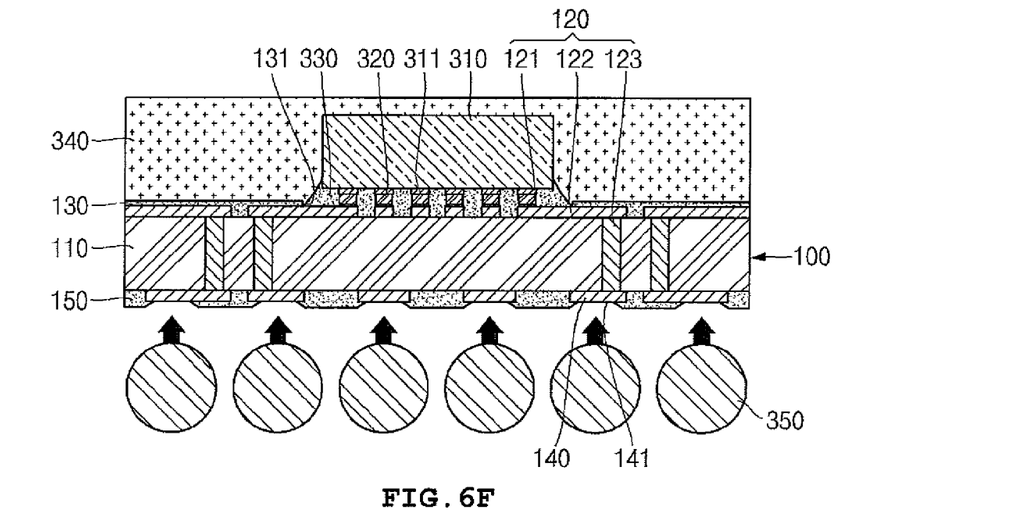

As illustrated in FIG. 6F, in the soldering of the solder balls (S5), the solder balls 350 may be welded to the ball lands 141 of the electrically conductive patterns 140 formed in the circuit board 100. For example, the solder balls 350 may be put on the ball lands 141 and then the circuit board 100 may be put in and drawn out from a furnace of approximately 150 to 250 degrees Celsius, so that the solder balls 250 may be melted and securely fixed to the ball lands 141.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A circuit board comprising:
    an insulative layer including a first surface and a second surface opposite to the first surface;
    a plurality of electrically conductive patterns formed on the first surface of the insulative layer;
    conductive lands formed in a die mounting region of the first surface of the insulative layer and electrically connected to one of the plurality of conductive patterns on the first surface;
    an extending pattern extending from the conductive lands to outside of the mounting region; and
    a protective layer covering the first surface of the insulative layer and the electrically conductive patterns; and
    a plurality of trenches formed in the protective layer to expose the conductive lands, the extending patterns and portions of the insulative layer, wherein a width of each of the plurality of trenches narrower than a width of a die mounting region.

2. The circuit board of claim 1, wherein the trench is formed in an approximately linear shape.

3. The circuit board of claim 1, wherein the trench is formed in an approximately linear shape along the conductive lands.

4. The circuit board of claim 1, wherein portions of the conductive lands are covered with the protective layer.

5. The circuit board of claim 1, wherein the trench is formed to have an area equal to that of the mounting region.

6. The circuit board of claim 1, further comprising:
    a plurality of electrically conductive patterns formed in the second surface; and
    a plurality of ball lands coupled to electrically conductive patterns formed in the second surface.

7. The circuit board of claim 1, further comprising conductive vias formed through the insulative layer to connect the electrically conductive patterns on the first surface to electrically conductive patterns of the second surface.

8. A semiconductor device comprising:
    an insulative layer including a first surface and a second surface opposite to the first surface;
    a plurality of electrically conductive patterns formed on the first surface of the insulative layer;
    conductive lands formed in a mounting region of the first surface of the insulative layer and electrically connected to one of the plurality of conductive patterns on the first surface;
    an extending pattern extending from the conductive lands to outside of the mounting region;
    a protective layer covering the first surface of the insulative layer and the electrically conductive patterns;
    a plurality of trenches formed in the protective layer to expose the conductive lands, extending patterns, and portions of the first surface of the insulative layer, wherein a width of each of the plurality of trenches is narrower than a width of a die mounting region;
    a semiconductor die having bond pads positioned in the mounting region;
    an electrical conductor electrically connecting the conductive lands to the bond pads of the semiconductor die;
    an underfill disposed between the mounting region and the semiconductor die; and
    an encapsulant encapsulating the semiconductor die, the electrical conductor, and the underfill.

9. The semiconductor device of claim 8, wherein the plurality of trenches is formed in the die mounting region.

10. The semiconductor device of claim 8, wherein the trench is formed in an approximately linear shape.

11. The semiconductor device of claim 8, wherein portions of the conductive lands are covered with the protective layer.

12. The semiconductor device of claim 8, wherein the trench is formed in an approximately linear shape along the plurality of conductive lands.

13. The semiconductor device of claim 8, wherein the trench is formed to have an area equal to that of the mounting region.

14. The semiconductor device of claim 8, further comprising:
    a plurality of electrically conductive patterns formed in the second surface;
    a plurality of ball lands coupled to the electrically conductive patterns formed in the second surface; and conductive vias formed through the insulative layer to connect the electrically conductive patterns on the first surface to the electrically conductive patterns of the second surface.

15. A method of manufacturing a semiconductor device comprising:

providing a circuit board comprising:

an insulative layer including a first surface and a second surface opposite to the first surface;

a plurality of electrically conductive patterns formed on the first surface of the insulative layer;

conductive lands formed in a mounting region of the first surface of the insulative layer and electrically connected to one of the plurality of conductive patterns on the first surface;

an extending pattern extending from the conductive lands to outside of the mounting region;

applying a protective layer to the first surface of the insulative layer and the electrically conductive patterns;

forming a plurality of trenches in the protective layer to expose the conductive lands, the extending patterns, and portions of the first surface of the insulative layer, wherein a width of each of the plurality of trenches is narrower than a width of a die mounting region;

electrically coupling a semiconductor die to the conductive lands in the mounting region;

placing an underfill between the mounting region and the semiconductor die; and encapsulating the semiconductor device.

* * * * *